(12) United States Patent
Lavoie et al.

(10) Patent No.: US 7,605,073 B2
(45) Date of Patent: Oct. 20, 2009

(54) SEALANTS FOR METAL INTERCONNECT PROTECTION IN MICROELECTRONIC DEVICES HAVING AIR GAP INTERCONNECT STRUCTURES

(75) Inventors: Adrien R. Lavoie, Beaverton, OR (US); Arnel M. Fajardo, Beaverton, OR (US); Vijayakumar S. Ramachandrarao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 398 days.

(21) Appl. No.: 11/437,319

(22) Filed: May 19, 2006

(65) Prior Publication Data

US 2007/0269956 A1    Nov. 22, 2007

(51) Int. Cl.
*H01L 21/4763*    (2006.01)

(52) U.S. Cl. ..................................................... 438/619
(58) Field of Classification Search ................ 438/619, 438/618; 257/E23.013
See application file for complete search history.

(56) References Cited

U.S. PATENT DOCUMENTS

| | | | |
|---|---|---|---|
| 6,413,852 B1 * | 7/2002 | Grill et al. ................... | 438/619 |
| 7,088,003 B2 * | 8/2006 | Gates et al. .................. | 257/774 |
| 7,301,107 B2 * | 11/2007 | Karthikeyan et al. ......... | 174/262 |
| 2008/0079172 A1 * | 4/2008 | Hsu et al. .................... | 257/774 |

* cited by examiner

*Primary Examiner*—Bradley K Smith

(57) ABSTRACT

Embodiments of the invention include apparatuses and methods relating to air gap interconnect structures having interconnects protected by a sealant. In various embodiments, the sealant includes alumina or silicon nitride. In some embodiments, the interconnect structures include cobalt alloy liners and cobalt shunts to encase a conductive material.

12 Claims, 3 Drawing Sheets

SEALANTS FOR METAL INTERCONNECT PROTECTION IN MICROELECTRONIC DEVICES HAVING AIR GAP INTERCONNECT STRUCTURES

TECHNICAL FIELD

Embodiments of the invention relate to microelectronics processing technology. In particular, embodiments of the invention relate to microelectronic devices having air gap interconnect structures.

BACKGROUND

In microelectronics processing, transistors and other devices are formed on a substrate surface. The transistors and other devices are then interconnected with each other and external circuitry by multiple layers of metal lines and through vias which are formed over the transistors and other devices. Typically, the transistors and other devices are first contacted by metallic vias. Then, a number of alternating layers of metal lines (e.g., copper lines) and conductive through vias are formed to provide the interconnect structure. Two important factors in the performance of the interconnect structure are the resistance (R) of the conductive lines and vias and the capacitance (C) of the dielectric materials that separate the conductive lines and vias. The dielectric materials that separate the lines and vias are, in some cases, low dielectric constant ("low-k") materials.

Low-k materials are used because they reduce the capacitance between adjacent metal lines and thereby improve the performance of the overall microelectronic device, for example by reducing RC delay. As transistors and the interconnect structures continue to become smaller and more advanced, it is desirable to continue to reduce the dielectric constant of the materials used. The lower limit for a dielectric constant is k=1, which is the dielectric constant of a vacuum. In order to approach this limit, methods and structures incorporating air gaps (air having a k value close to 1) into the interconnect structure have been proposed. Incorporating air gaps into the interconnect structure of a microelectronic device has numerous difficulties. In some processes, the metal lines may oxidize, which increases their electrical resistance and the likelihood of device failure.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, apparatuses and methods relating to microelectronic devices having air gap technology are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the implementation of interconnect structures having air gaps, it may be desirable to eliminate or reduce oxidation of the conductive interconnects. By eliminating or reducing such oxidation, the likelihood of interconnect failure, due to electromigration and other causes, may be reduced. Further, eliminating or reducing oxidation may eliminate or reduce the undesired effect of increasing the electrical resistance of the interconnects. The undesired oxidation may be caused during the wet etch removal of dielectric material used during the formation of the air gaps in some implementations or by the exposure of the interconnects to oxygen in the air. Briefly, the present description provides structures and methods that enable the fabrication of air gap interconnect structures that eliminate or reduce oxidation of the conductive interconnects by encapsulating them in a sealant layer.

FIGS. 1-9 illustrate methods for forming an air gap interconnect structure that eliminates or reduces oxidation of the conductive interconnects.

Figure 1:
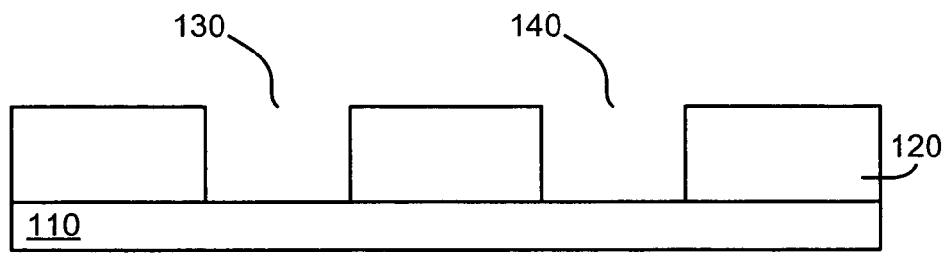
FIG. 1 is a cross-sectional illustration of a patterned layer having openings on a substrate.

FIG. 1 illustrates a patterned layer 120 on a substrate 110. Patterned layer 120 includes openings 130, 140 that expose regions of substrate 110 and define areas for the formation of interconnect structures.

Substrate 110 may include any suitable material or materials in any suitable configuration. For example, substrate 110 may include a monocrystalline silicon, silicon-on-insulator, or other suitable semiconductor material. Further, substrate 110 may include transistors and other devices, such as resistors. In one example, patterned layer 120 defines a pattern for a first level of interconnects. Substrate 110 may then include a device layer and a layer of conductive contacts surrounded by a dielectric material. In another example, patterned layer 120 defines a pattern for a second level of interconnects. Substrate 110 may then include a device layer, a contact layer, a first level interconnect layer (which may include an air gap structure), and a layer of dielectric material including patterned via trenches or filled via trenches. In yet other examples, patterned layer 120 defines a pattern for a higher level (third, fourth, etc.) of interconnects. Substrate 110 may then include a device layer, a contact layer, and alternating layers of conductive interconnects and vias with the top layer including a layer of dielectric material including patterned via trenches or filled via trenches.

Patterned layer 120 includes any suitable material that defines a pattern for interconnect structures and has a suitable etch selectivity between it and the immediately adjacent dielectric layer of substrate 110. For instance, patterned layer 120 may be a patterned interlayer dielectric (ILD). Patterned layer 120 may be formed by known techniques, such as photolithography and etch techniques.

Figure 2:
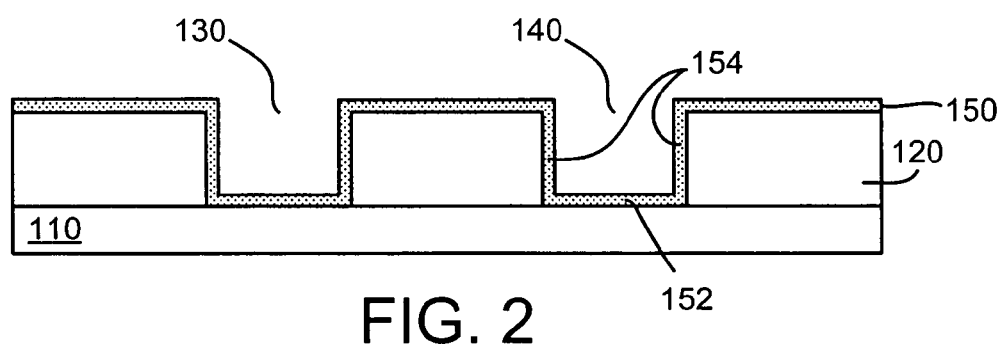
FIG. 2 illustrates the structure of FIG. 1 with a sealant layer formed over the patterned layer and the substrate.

As illustrated in FIG. 2, a sealant layer 150 is formed over patterned layer 120 and the exposed regions of substrate 110 such that openings 130, 140 are lined with the sealant material. Sealant layer 150 may include any suitable material that provides a hermetic seal against water and oxygen, has a relatively low dielectric constant, and provides uniform deposition properties. In one embodiment, sealant layer 150 is alumina. In another embodiment, sealant layer 150 is silicon nitride. In another embodiment, sealant layer 150 is a silicon carbide. In yet another embodiment, sealant layer 150 includes a silicon carbide/silicon nitride mixture. Sealant layer 150 may be formed by known techniques. In examples where there is an exposed via trench under patterned layer 120, sealant layer 150 may also line the exposed via trench.

In embodiments where sealant layer 150 is alumina, a precursor or seed layer may be formed prior to atomic layer deposition (ALD) of the alumina. Suitable precursors include aluminum s-butoxide, trimethylaluminum (AlMe3 or TMA), triethylaluminum (AlEt3 or TEA), di-i-butylaluminum chloride, di-i-butylaluminum hydride, diethylaluminum chloride, Tri-i-butylaluminum, triethyl(tri-sec-butoxy)dialuminum, and methylpyrrolidine alane (or related derivatives/precursors). In embodiments where sealant layer 150 is silicon nitride, silicon carbide, or silicon carbide/silicon nitride mixture, the layer may be formed by ALD or chemical vapor deposition (CVD) techniques.

Figure 2A:
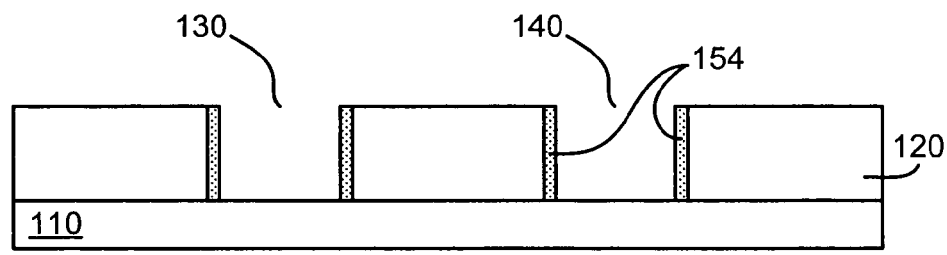
FIG. 2A illustrates the structure of FIG. 2 with portions of the sealant layer removed.

In the embodiment illustrated, sealant layer 150 may be part of the conductive path of the interconnect structure formed. For example, if patterned layer 120 is formed over filled via trenches, sealant layer 150 would be between the via and the metal line formed over it. Or, if patterned layer 120 is formed over a patterned via trench, sealant layer 150 will line the via trench and would be disposed between the metal line below the via trench and the subsequently formed conductive via. If sealant layer 150 includes an insulative material (which may be advantageous for reducing cross talk between interconnects), it may increase the overall resistance of the interconnects. That result may be mitigated or eliminated by forming a thin sealant layer 150 or by performing an anisotropic etch to remove the bottom portion 152 of sealant layer 150 while sidewall portions 154 of sealant layer 150 remain, as is illustrated in FIG. 2A. This anisotropic etch of the bottom portion of the sealant layer may be accomplished, for example, through use of a plasma-based $BCl_3/Cl_2$ etch, with or without $C_4F_6$ as a source of sidewall polymer. FIG. 2A also shows that portions of sealant layer 150 over patterned layer 120 may be removed during the anisotropic etch. Those portions may then not need to be removed during the removal process described with reference to FIG. 5.

Figure 3:
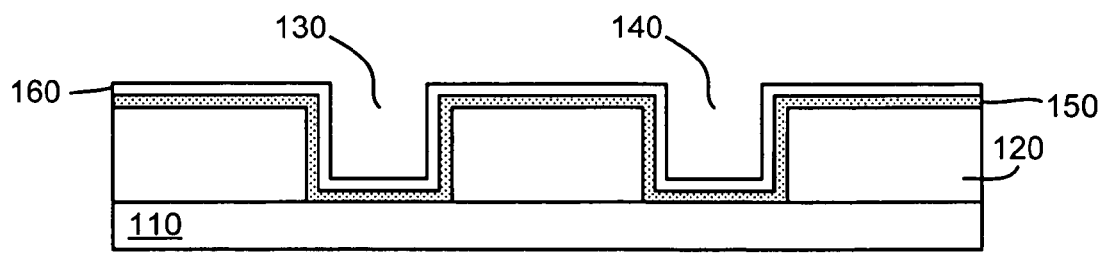
FIG. 3 illustrates the structure of FIG. 2 with a barrier layer formed over the sealant layer.

The method may continue with or without the described anisotropic etch. In the subsequent figures, the structure of FIG. 2 is used for illustration purposes. As illustrated in FIG. 3, a barrier layer 160 may optionally be formed on sealant layer 150. In one embodiment, barrier layer 160 includes tantalum and tantalum nitride. In another embodiment, barrier layer 160 includes titanium and titanium nitride. In another embodiment, barrier layer 160 includes a cobalt alloy, such as CoBP, CoW, or CoWBP. In examples where there is an exposed via trench under patterned layer 120, barrier layer 160 may also form in the via trench.

In embodiments where barrier layer 160 is a cobalt alloy, a precursor or seed layer may be formed prior to ALD or PVD of the cobalt alloy. The precursor may include bis(N,N'-di-sec-butylacetamidinato)cobalt, bis(N,N'-di-isopropylacetamidinato)cobalt, bis(N,N'-di-isopropyldimethylaminoacetamidinato)cobalt, bis(cyclopentadienyl)cobalt (II) ("cobaltocene"), cyclopentadienylcobalt dicarbonyl, cobalt acetylacetonate, cobalt tricarbonyl nitrosyl, bis(N,N'-diisopropylacetamidinato)cobalt(II), Tris(2,2,6,6-tetramethyl-3,5-heptanedionato)cobalt (III), or other suitable precursors.

Figure 4:
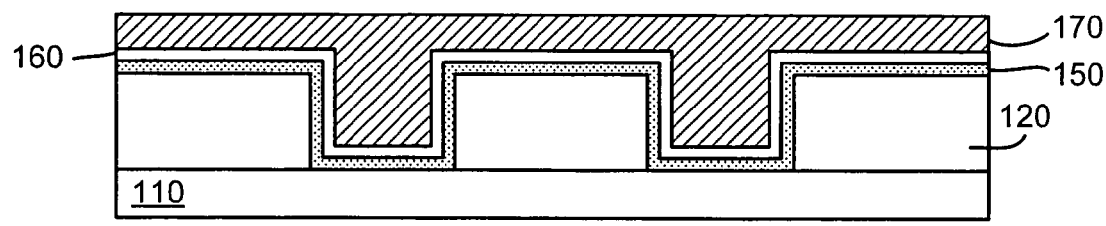
FIG. 4 illustrates the structure of FIG. 3 with a conductive gap fill formed over the barrier layer.

As illustrated in FIG. 4, a conductive fill 170 is formed to fill the openings in the sealed patterned layer 120. Conductive fill 170 may include any suitable conductive material, such as copper. In forming conductive fill 170, a seed layer may first be formed. For example, a seed layer may first be formed over barrier layer 160 (or sealant layer 150 if there is no barrier layer) by ALD, PVD, or chemical vapor deposition (CVD) techniques. The bulk of conductive fill 170 may then be formed by an electroplating technique. In examples where there is an exposed via trench under patterned layer 120, conductive fill 170 may also fill the via trench to form a filled via.

Figure 5:
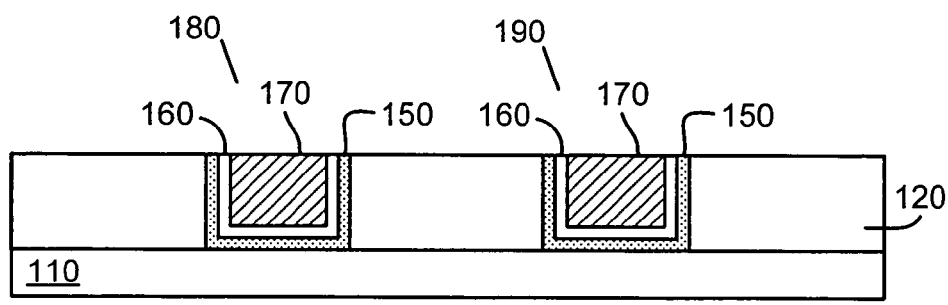
FIG. 5 illustrates the structure of FIG. 4 with portions of the conductive fill, the barrier layer, and the sealant layer removed to expose the patterned layer and to form interconnect structures.

As illustrated in FIG. 5, portions of conductive fill 170, barrier layer 160, and sealant layer 150 are removed to form interconnect structures 180, 190. Interconnect structures 180, 190 may alternatively be referred to as interconnect elements or conductive elements. The materials may be removed by a chemical mechanical polish (CMP) step. The materials may be removed such that a substantially planar surface is provided at the height of the patterned layer 120, or some of patterned layer 120 may be removed such that the height is less than the original height of patterned layer 120.

In general, interconnect structures 180, 190 include an interconnect or line portion and a sealant material. In FIG. 5, the interconnect or line includes conductive fill 170 and barrier layer 160, and the sealant material is sealant layer 150. As noted above however, barrier layer 160 is optional, and therefore in one embodiment, the interconnect or line may include only a conductive fill material without a barrier layer. Further, as discussed above, the conductive fill may include a seed layer and a bulk fill material.

As shown in FIG. 5, the sealant material is around the bottom surface and two side surfaces of the interconnect structure while the top surface is exposed. In another embodiment, as shown in FIG. 2A, the portion of the sealant material on the bottom surface may have been removed by an anisotropic etch, and the sealant may cover only the two side surfaces of the interconnect structure. Herein, the term "bottom surface" refers to the surface that is toward or adjacent to the substrate, such that the substrate is used as the frame of reference and subsequent structures are built "up" upon the substrate. Therefore, use of terms such as bottom, top, over, and side are with reference to the arbitrary reference of the substrate as being toward the bottom of the structure, and not referring to "up" or "down" in reference to the ground or any other frame of reference.

As is discussed further in reference to FIGS. 7A and 7B below, a cap or shunt may be formed on interconnect structures 180, 190 after the removal of patterned layer 120. In another embodiment, a cap or shunt may be formed over interconnect structures 180, 190 prior to removal of patterned layer 120. Forming the cap or shunt prior to removing patterned layer 120 may offer the advantage of blocking any formation along the side surfaces of interconnect structures

180, 190. This cap or shunt may be formed, for example, by selective electroless plating of cobalt alloys such as CoBP, CoWP, CoWB, and CoWBP.

Figure 6:
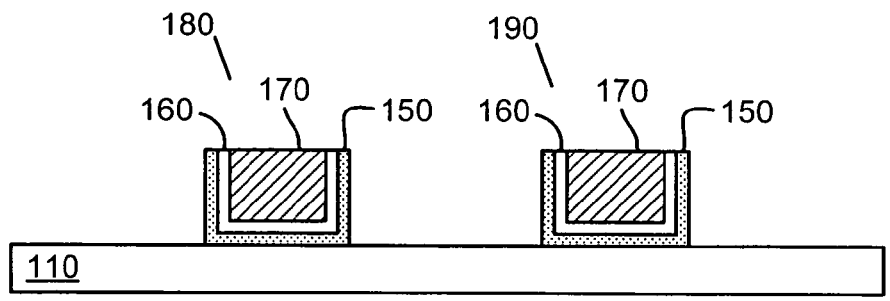
FIG. 6 illustrates the structure of FIG. 5 with the patterned layer removed.

As illustrated in FIG. 6, patterned layer 120 is removed. As shown, patterned layer 120 may be entirely removed. In other examples, the majority of patterned layer 120 may be removed while portions, such as stringers or residues, of the layer remain. Patterned layer 120 may be removed by any suitable technique, such as a wet etch step. As discussed with respect to FIG. 1, patterned layer 120 may have a suitable etch selectivity with the underlying material or materials of substrate 110.

During the removal of patterned layer 120, chemicals may be used that would oxidize barrier layer 160 or conductive fill 170 in the absence of sealant layer 150. For example, sealant layer 150 provides a hermetic seal against water and other chemicals to protect barrier layer 160 or conductive fill 170. Removal of patterned layer 120 may facilitate the formation of air gaps as is described below in reference to FIG. 8.

Figure 7A:
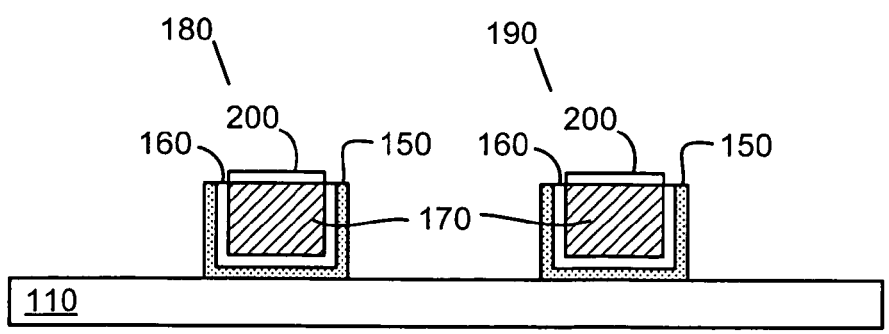
FIG. 7A illustrates the structure of FIG. 6 with one example of caps covering the interconnect structures.
Figure 7B:
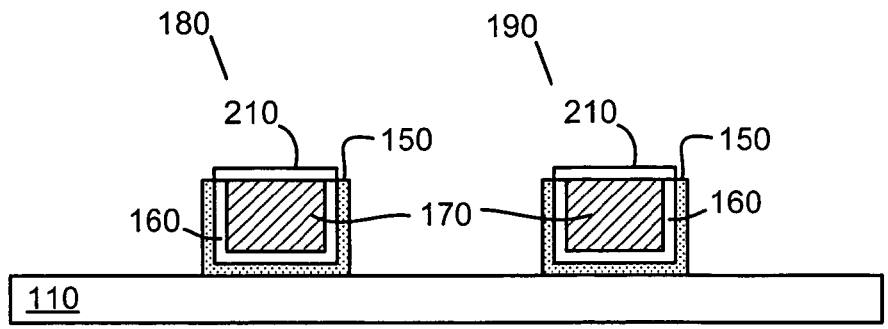
FIG. 7B illustrates the structure of FIG. 6 with another example of caps covering the interconnect structures.

As illustrated in FIGS. 7A and 7B, an optional cap or shunt 200 or 210 may be formed on interconnect structures 180, 190. A cap or shunt may offer the advantages of improving the electromigration properties and reducing failures of interconnect structures 180, 190. For example, a cobalt alloy shunt may reduce negative electromigration effects along the top surface of interconnect structures 180, 190. In one embodiment, as shown in FIG. 7A, shunt 200 may cover only conductive fill 170. In particular, if the material of shunt 200 will not form on the material of barrier layer 160, the shunt may cover only conductive fill 170. For example, if conductive fill 170 is copper and barrier layer 160 is tantalum and tantalum nitride, a cap of cobalt will not form over the tantalum and tantalum nitride barrier layer.

In another embodiment, as illustrated in FIG. 7B, shunt 210 may cover conductive fill 170 and barrier layer 160. If the material of shunt 210 will form on the material of barrier layer 160, the shunt will cover conductive fill 170 and barrier layer 160. Such a configuration may be advantageous because it eliminates the exposed seam of barrier layer 160 which may be a site for undesired oxidation of the conductive fill material and electrical cross talk with adjacent interconnects. For example, if conductive fill 170 is copper and barrier layer 160 is a cobalt alloy, a cap of cobalt will form over the cobalt alloy barrier layer.

Figure 8:
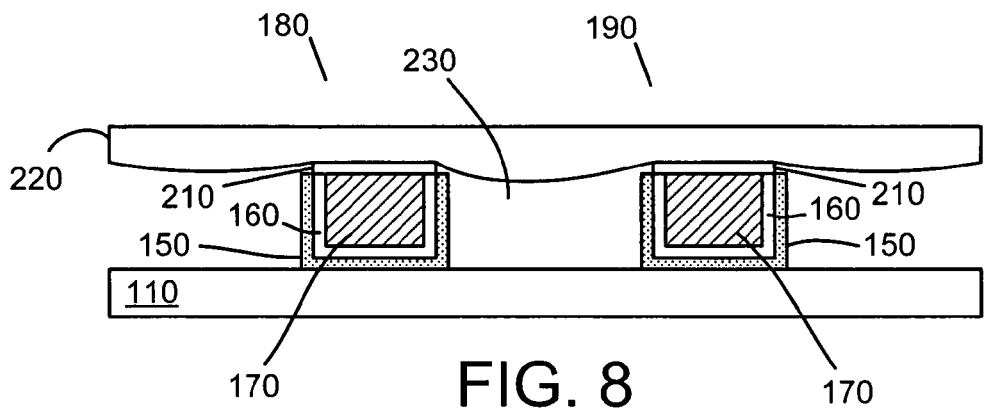
FIG. 8 illustrates the structure of FIG. 7B with a dielectric layer formed over the interconnect structures to form air gaps between the interconnect structures.
Figure 9:
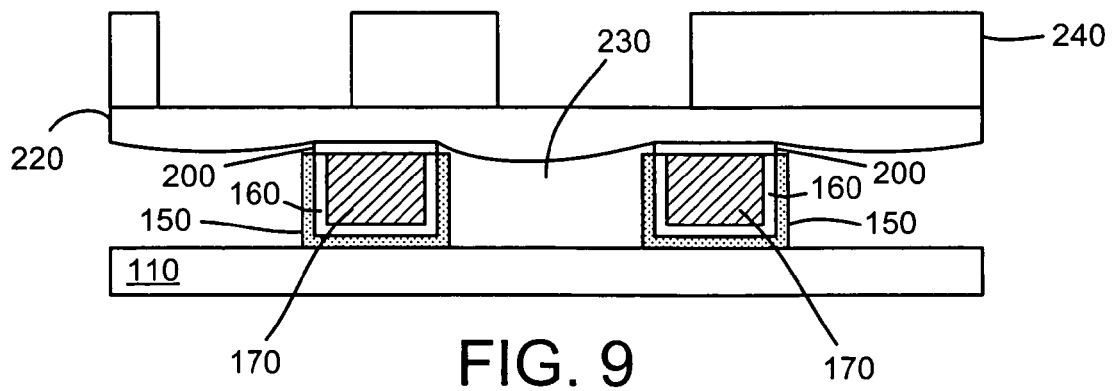
FIG. 9 illustrates the structure of FIG. 8 with a patterned layer formed over the dielectric layer.

The method may continue with either of the described shunts or without a shunt. In FIGS. 8 and 9, the shunt of FIG. 7B is used for purposes of illustration. As illustrated in FIG. 8, a dielectric layer 220 may be formed over interconnect structures 180, 190 to form an air gap 230. Dielectric layer 220 may be formed by known methods, including CVD, and may include via trench openings. If the processing conditions and the spacing between adjacent interconnects are carefully selected, dielectric layer 220 will not fill the gaps between interconnect structures 180, 190.

The air gaps thus formed may provide an extremely low-k (approaching k=1) environment for interconnect structures 180, 190 and may thereby reduce the capacitance between interconnect structures 180, 190. The RC delay and performance of the microelectronic device is therefore improved. Further, sealant layer 150 continues to protect conductive fill 170 and optional barrier layer 160 from oxidation due to the oxygen in the air gap. By reducing or eliminating oxidation, the performance and reliability of interconnect structures 180, 190 is improved.

The described methods may be repeated to form additional interconnect layers including air gaps. In particular, as is shown in FIG. 9, a patterned layer 240 may be formed over dielectric layer 220 as an initial step in the repeated method. In FIG. 9, the openings in patterned 240 indicate that interconnects may be formed as coming into or out of the page. In other examples, the interconnects may be formed orthogonal to the interconnects of the level below. As will be appreciated, FIG. 9 is analogous to FIG. 1. The described methods may therefore be repeated in order to form any suitable number of interconnect levels including air gaps.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method for forming a microelectronic device having an air gap interconnect structure comprising:
    forming a patterned layer including an opening on a substrate;
    disposing a sealant layer over the patterned layer and lining the opening;
    disposing a barrier layer over the sealant layer,
    disposing an interconnect metal over the barrier layer, wherein the interconnect metal fills the opening of the patterned layer,
    removing portions of the interconnect metal, the barrier layer, and the sealant layer to expose the patterned layer and to form an interconnect structure including the interconnect metal, the barrier layer, and the sealant layer,
    removing at least a portion of the patterned layer, wherein the sealant layer protects the interconnect metal and the barrier layer from oxidation and
    anisotropically etching the sealant layer to expose the region of the substrate, wherein the anisotropic etch removes the portion of the sealant layer over the patterned layer, and wherein removing portions of the interconnect metal and the barrier layer includes a chemical mechanical polish.

2. The method of claim 1, further comprising:
    forming a dielectric layer over the interconnect structure and a second interconnect structure, wherein forming the dielectric layer forms an air gap between the interconnect structure, the second interconnect structure, the substrate, and the dielectric layer.

3. The method of claim 1, wherein the sealant layer comprises alumina.

4. The method of claim 1, wherein the sealant layer comprises at least one of silicon nitride or silicon carbide.

5. The method of claim 1, further comprising:
    forming a cap over the interconnect structure.

6. The method of claim 5, wherein the cap comprises a cobalt alloy and the barrier layer comprises a second cobalt alloy, and wherein the cap extends over the interconnect metal and the barrier layer.

7. The method of claim 1, wherein the barrier layer comprises at least one of tantalum or titanium.

8. A microelectronic device having an air gap interconnect structure comprising:
- a first interconnect element having a top surface, a bottom surface, and two side surfaces, wherein the bottom surface is adjacent to a substrate surface;
- a sealant layer on the bottom surface and the two side surfaces of the first interconnect element to hermetically seal the bottom surface and the two side surfaces of the first interconnect element against oxidation;
- a metallic cap on the top surface of the interconnect structure;
- a layer over the first interconnect element and a second interconnect element; and
- an air gap between the substrate surface, the first interconnect element, the layer, and
- the second interconnect element, wherein:
- the interconnect structure comprises a conductive fill material and a barrier layer between the conductive fill material and the sealant layer; and
- the barrier layer comprises a cobalt alloy, the metallic cap comprises a second cobalt alloy, and the metallic cap covers the conductive fill material and extends over the barrier layer.

9. The microelectronic device of claim 8, wherein the sealant layer comprises alumina.

10. The microelectronic device of claim 8, wherein the sealant layer comprises at least one of silicon nitride or silicon carbide.

11. The microelectronic device of claim 8, wherein the barrier layer comprises tantalum and wherein the metallic cap covers the conductive fill material but does not extend over the barrier layer.

12. A method for forming a microelectronic device having an air gap interconnect structure comprising:
- forming a patterned layer including an opening on a substrate;
- disposing a sealant layer over the patterned layer and lining the opening;
- disposing a baffler layer over the sealant layer;
- disposing an interconnect metal over the barrier layer, wherein the interconnect metal fills the opening of the patterned layer;
- removing portions of the interconnect metal, the barrier layer, and the sealant layer to expose the patterned layer and to form an interconnect structure including the interconnect metal, the barrier layer, and the sealant layer;
- removing at least a portion of the patterned layer, wherein the sealant layer protects the interconnect metal and the barrier layer from oxidation; and
- forming a cap over the interconnect structure, wherein the cap comprises a cobalt alloy and the barrier layer comprises a second cobalt alloy, and wherein the cap extends over the interconnect metal and the barrier layer.

* * * * *

UNITED STATES PATENT AND TRADEMARK OFFICE
CERTIFICATE OF CORRECTION

PATENT NO. : 7,605,073 B2  Page 1 of 1
APPLICATION NO. : 11/437319
DATED : October 20, 2009
INVENTOR(S) : Lavoie et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 552 days.

Signed and Sealed this

Fifth Day of October, 2010

David J. Kappos
*Director of the United States Patent and Trademark Office*